(12) United States Patent
Lin et al.

(10) Patent No.: US 10,040,994 B2
(45) Date of Patent: Aug. 7, 2018

(54) PHOSPHOR, FABRICATING METHOD THEREOF, AND LIGHT-EMITTING DEVICE AND BACKLIGHT MODULE EMPLOYING THE SAME

(71) Applicant: LEXTAR ELECTRONICS CORPORATION, Hsinchu (TW)

(72) Inventors: Chun Che Lin, Yilan County (TW); Ling-Ling Wei, Xi'an (CN); Huan Jiao, Xi'an (CN); Ru-Shi Liu, New Taipei (TW); Ching-Yi Chen, New Taipei (TW); Yu-Chun Lee, Hsinchu County (TW); Tzong-Liang Tsai, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/154,747

(22) Filed: May 13, 2016

(65) Prior Publication Data

US 2016/0340579 A1 Nov. 24, 2016

(30) Foreign Application Priority Data

May 21, 2015 (CN) .......................... 2015 1 0262196

(51) Int. Cl.
 *G09F 13/04* (2006.01)
 *C09K 11/66* (2006.01)
 (Continued)

(52) U.S. Cl.
 CPC .......... *C09K 11/665* (2013.01); *G02F 1/1336* (2013.01); *H01L 33/502* (2013.01);
 (Continued)

(58) Field of Classification Search
 USPC .................................................. 362/97, 97.1
 See application file for complete search history.

(56) References Cited

U.S. PATENT DOCUMENTS 7,497,973 B2    3/2009  Radkov et al.
8,237,348 B2    8/2012  Masuda et al.
 (Continued)

FOREIGN PATENT DOCUMENTS

CN    101705095        5/2010
EP    2508586 A2       10/2012
 (Continued)

OTHER PUBLICATIONS

Xianyu Jiang et al., "A Red Phosphor $BaTiF_6:Mn^{4+}$: Reaction Mechanism, Microstructures, Optical Properties, and Applications for White LEDs," Dalton Transactions, Apr. 2014, pp. 9414-9418 vol. 43, The Royal Science of Chemistry, US.
 (Continued)

*Primary Examiner* — Jamara Franklin

(57) ABSTRACT

The present invention provides a phosphor represented by the following formula: $K_2[Ge_{1-x}F_6]:Mn_x^{4+}$, wherein $0<x<0.2$. The phosphor has a hexagonal phase of a $P6_3mc$ space group. The present invention also provides a method for fabricating the above phosphor. The present invention further provides a light-emitting device and a backlight module employing the same.

15 Claims, 4 Drawing Sheets

(51) Int. Cl.
  *G02F 1/13357* (2006.01)
  *H01L 33/50* (2010.01)
  *H01L 33/54* (2010.01)
  *H01L 33/62* (2010.01)

(52) U.S. Cl.
  CPC ............ *H01L 33/507* (2013.01); *H01L 33/54* (2013.01); *H01L 33/62* (2013.01); *Y02B 20/181* (2013.01)

(56) References Cited

U.S. PATENT DOCUMENTS

| | | | |
|---|---|---|---|
| 8,252,613 | B1 | 8/2012 | Lyons et al. |
| 8,362,685 | B2 | 1/2013 | Masuda et al. |
| 8,491,816 | B2 | 7/2013 | Hong et al. |
| 2012/0161170 | A1 | 6/2012 | Dubuc et al. |
| 2012/0320607 | A1* | 12/2012 | Kinomoto ............ H01L 27/322 362/351 |

FOREIGN PATENT DOCUMENTS

| | | |
|---|---|---|
| EP | 2663611 B1 | 7/2014 |
| JP | 2013-14715 A | 1/2013 |
| WO | WO 2013088313 A1 | 6/2013 |
| WO | WO 2013121355 A1 | 8/2013 |

OTHER PUBLICATIONS

Lifen Lv et al., "The Formation Mechanism, Improved Photoluminescence and LED Applications of Red Phosphor $K_2SiF_6:Mn^{4+}$," Journal of Materials Chemistry C, Mar. 2014, pp. 3879-3884, vol. 2, The Royal Science of Chemistry, US.

Xianyu Jiang et al., "Hydrothermal Synthesis and Photoluminescence Properties of Red Phosphor $BaSiF_6:Mn^{4+}$ for LED Applications," Journal of Materials Chemistry C, Jan. 2014, pp. 2301-2306, vol. 2, The Royal Science of Chemistry, US.

Sadao Adachi et al., "Synthesis and Properties of Hetero-Dialkaline Hexafluorosilicate Red Phosphor $KNaSiF_6:Mn^{4+}$," Journal of the Electrochemical Society, Dec. 2011, pp. J34-J37, vol. 159, issue 2, The Electrochemical Society, US.

Ryota Kasa et al., "Red and Deep Red Emissions from Cubic $K_2SiF_6:Mn^{4+}$ and Hexagonal $K_2MnF_6$ Synthesized in $HF/KMnO_4/KHF_2/Si$ Solutions," Journal of the Electrochemical Society, Jan. 2012, pp. J89-J95, vol. 159, issue 4, The Electrochemical Society, US.

Sadao Adachi et al., "Photoluminescent Properties of $K_2GeF_6:Mn^{4+}$ Red Phosphor Synthesized from Aqueous $HF/KMnO_4$ Solution," Journal of Applied Physics, Jul. 2009, pp. 013516-1-013516-6, vol. 106, American Institute of Physics, US.

Toru Takahashi et al., "$Mn^{4?+?}$-Activated Red Photoluminescence in $K_2SiF_6$ Phosphor," Journal of the Electrochemical Society, Oct. 2008, pp. E183-E188, vol. 155, issue 12, The Electrochemical Society, US.

Wei et al., "Photoluminescent Evolution Induced by StructuralTransformation Through Thermal Treating in the Red Narrow-Band Phosphor $K_2GeF_6\ Mn^{4+}$," ACS Appl. Mater. Interfaces 2015, May 2015 pp. 10656-10659, vol. 7, American Chemical Society, US.

Lifen Lv et al, "The formation mechanism, improved photoluminescence and LED applications of red phosphor $K_2SiF_6:Mn^{4+}$," Journal of Materials Chemistry C, Mar. 2014, pp. 3879-3884, vol. 2, The Royal Society of Chemistry, US.

China Patent Office, Office Action, Patent Application Serial No. 201510262196.6, dated Dec. 20, 2017, China.

* cited by examiner

PHOSPHOR, FABRICATING METHOD THEREOF, AND LIGHT-EMITTING DEVICE AND BACKLIGHT MODULE EMPLOYING THE SAME

CROSS REFERENCE TO RELATED APPLICATIONS

This Application claims priority of China Patent Application No. 201510262196.6, filed on May 21, 2015, the entirety of which is incorporated by reference herein.

BACKGROUND OF THE INVENTION

Field of the Invention

The present invention relates to a phosphor, a fabricating method thereof, and a light-emitting device and a backlight module employing the same, and in particular it relates to a phosphor capable of increasing the color rendering index, a fabricating method thereof, and a light-emitting device and a backlight module employing the same.

Description of the Related Art

In recent years, energy-saving and environmental protection concepts have been a major concern. As new lighting sources, light-emitting diodes (LEDs) can solve the problems that cannot be conquered by traditional incandescent lamps or fluorescent lamps. Also, LEDs meet the requirements of low power consumption and environmental protection. Therefore, issues such as exploiting new energies and increasing energy efficiency have attracted the public's attention. Color LEDs have been used widely in colored lighting, displays, entertainments, and so on. The development of the electronic display industry has been the most rapid. It is believed that LEDs will play an important role in the photoelectric element applications in the future.

So far, the development of white light-emitting diodes (WLEDs) is the main global developmental direction of LEDs. WLEDs have advantages such as small size, low heat radiation, long life, and low power consumption. Those advantages further reveal the developmental value of WLEDs in the field of lighting for a new generation.

One of the most common WLEDs used in the industry include blue LED chips accompanied by YAG phosphor ($Y_3Al_5O_{12}$:Ce; Yttrium aluminum garnet). However, in order to remedy the red light spectrum which YAG phosphor ($Y_3Al_5O_{12}$:Ce; Yttrium aluminum garnet) lacks, the process for the red light-emitting phosphor-added WLEDs has become a new issue. So far, there is lots of information about the synthesis and applications of the red light-emitting phosphor. For example, it is known that $A_2[MF_6]$:$Mn^{4+}$ (wherein A is Li, Na, K, Rb, Cs, $NH_4$; and M is Ge, Si, Sn, Ti, Zr) fluorides may serve as a red light-emitting phosphor for LEDs.

Therefore, for the current progress of LEDs to continue, it is important to provide a red light-emitting phosphor capable of increasing the color rendering index for WLEDs and a fabricating method thereof.

BRIEF SUMMARY OF THE INVENTION

According to an embodiment, a phosphor is provided. The phosphor is represented by the following formula: $K_2[Ge_{1-x}F_6]$:$Mn_x^{4+}$, wherein $0<x<0.2$. The phosphor has a hexagonal phase with a $P6_3mc$ space group.

According to another embodiment, a method for fabricating a phosphor is provided. In an embodiment of the method for fabricating the phosphor, a primary phosphor is provided. The primary phosphor is represented by the following formula: $K_2[Ge_{1-x}F_6]$:$Mn_x^{4+}$, wherein $0<x<0.2$. The primary phosphor has a hexagonal phase with a $P\bar{3}m1$ space group. A thermal treatment is performed to structurally change the primary phosphor to a phosphor having a hexagonal phase with a $P6_3mc$ space group.

According to another embodiment, a lighting apparatus is provided. The lighting apparatus includes an excitation light source and a luminescent material disposed on the excitation light source. The luminescent material includes a phosphor represented by the following formula: $K_2[Ge_{1-x}F_6]$:$Mn_x^{4+}$, wherein $0<x<0.2$. The phosphor has a hexagonal phase with a $P6_3mc$ space group.

According to yet another embodiment, a backlight module is provided. The backlight module includes at least one of the lighting apparatuses above.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
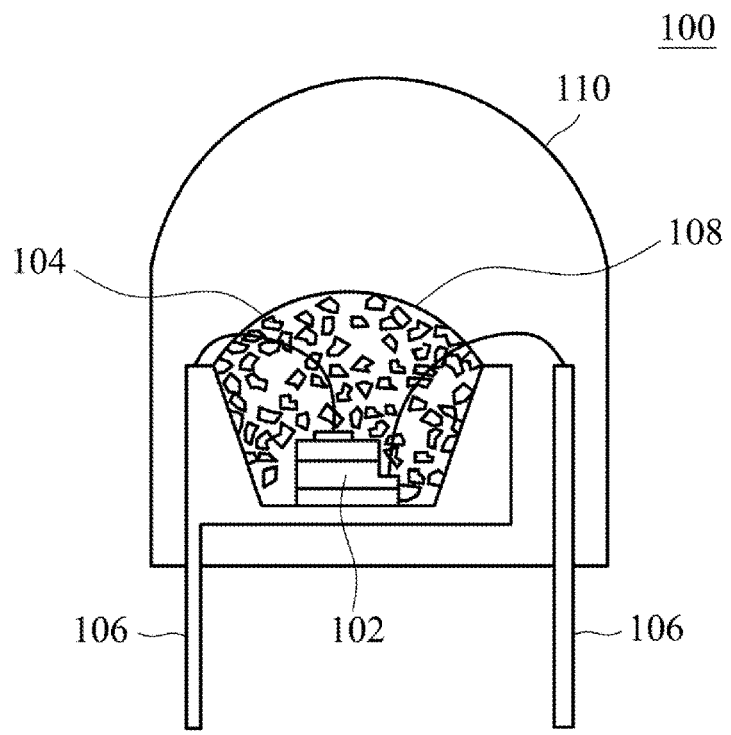
FIGS. 1A and 1B illustrate cross-sectional views of lighting apparatuses in accordance with some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

The present disclosure provides a phosphor capable of increasing the color rendering index and a fabricating method thereof. The structure of $K_2[Ge_{1-x}F_6]:Mn_x^{4+}$ phosphor is changed from a hexagonal phase with a $P\bar{3}m1$ space group to a hexagonal phase with a $P6_3mc$ space group after a thermal treatment. The structurally changed phosphor shows a zero phonon line (ZPL) peak. The resulting phosphor may be used to enable blue LEDs to produce a red fluorescence. Alternatively, the resulting phosphor may be used to increase the color rendering index for WLEDs.

In one embodiment, a phosphor is provided. The phosphor is represented by the following formula: $K_2[Ge_{1-x}F_6]:Mn_x^{4+}$, wherein $0<x<0.2$. The phosphor has a hexagonal phase with a $P6_3mc$ space group. In one embodiment of the present disclosure, the formula of the phosphor may be $K_2Ge_{0.95}F_6:Mn_{0.05}^{4+}$. The phosphor may emit a red light having a peak wavelength in a range of 600 nm to 650 nm after being excited by a light having a peak wavelength in a range of about 320 nm to about 500 nm. Also, the phosphor shows a zero phonon line (ZPL) having a peak wavelength in a range of about 620 nm to about 625 nm.

It should be noted that the excitation light, which excites the red light-emitting phosphor provided in the present disclosure, has a peak wavelength which does not overlap with the peak wavelength of yellow light (from about 570 nm to about 590 nm). Accordingly, in a lighting apparatus containing an LED, for example, the possibility is low that the yellow light-emitting phosphor-generated yellow light, which is excited by the LED (such as a blue LED), will be absorbed by the red light-emitting phosphor provided in the present disclosure. Therefore, the color rendering index of the lighting apparatus may be increased by avoiding the loss of yellow light and by the red light generated by the red light-emitting phosphor provided in the present disclosure. In addition, it should also be noted that the excitation light, which excites the red light-emitting phosphor provided in the present disclosure, has a peak wavelength which does not overlap with the peak wavelength of green light (from about 495 nm to about 570 nm). Accordingly, in a lighting apparatus containing an LED, for example, the possibility is low that the green light-emitting phosphor-generated green light, which is excited by the LED (such as a blue LED), will be absorbed by the red light-emitting phosphor provided in the present disclosure. Therefore, the color rendering index of the lighting apparatus may be increased by avoiding the loss of green light and by the red light generated by the red light-emitting phosphor provided in the present disclosure. Therefore, any light having a peak wavelength in the range of about 320 nm to about 500 nm may be used as the excitation light of the phosphor provided in the present disclosure.

In another embodiment, a method for fabricating the above phosphor is also provided. Firstly, a primary phosphor is provided. The formula of the primary phosphor is $K_2[Ge_{1-x}F_6]:Mn_x^{4+}$, wherein $0<x<0.2$. The primary phosphor has a hexagonal phase with a $P\bar{3}m1$ space group. In one embodiment of the present disclosure, the formula of the primary phosphor may be $K_2Ge_{0.95}F_6:Mn_{0.05}^{4+}$. Next, a thermal treatment is performed to the primary phosphor. In some embodiments, the thermal treatment may be performed with a temperature in a range of about 250° C. to about 450° C., such as from about 300° C. to about 400° C., from about 400° C. to about 425° C., or from about 425° C. to about 450° C. In some embodiments, the thermal treatment may be performed for 10-30 minutes such as about 20 minutes. After the thermal treatment, the $K_2[Ge_{1-x}F_6]:Mn_x^{4+}$ primary phosphor having the hexagonal phase with a $P\bar{3}m1$ space group is structurally changed to a $K_2[Ge_{1-x}F_6]:Mn_x^{4+}$ phosphor having a hexagonal phase with a $P6_3mc$ space group which shows a zero phonon line (ZPL) having a peak wavelength in a range of about 620 nm to about 625 nm.

The $K_2[Ge_{1-x}F_6]:Mn_x^{4+}$ primary phosphor may be fabricated by using a two-step chemical co-precipitation process or other appropriate processes, for example.

In another embodiment, a lighting apparatus is provided. The lighting apparatus includes an excitation light source and a luminescent material disposed on the excitation light source. The excitation light source may include a light-emitting diode (LED) having an emission wavelength in a range of about 320 nm to about 500 nm. For example, the excitation light source may be a blue LED. The light-emitting wavelength of the blue LED is in a range of about 400 nm to about 500 nm, preferably from about 440 nm to about 480 nm.

In one embodiment, the luminescent material may include a phosphor represented by the following formula: $K_2[Ge_{1-x}F_6]:Mn_x^{4+}$, wherein $0<x<0.2$. The phosphor has a hexagonal phase with a $P6_3mc$ space group. The phosphor may emit a red light having a peak wavelength in a range of 600 nm to 650 nm after being excited by a light having a peak wavelength in a range of about 320 nm to about 500 nm. Also, the phosphor shows a zero phonon line (ZPL) having a peak wavelength in a range of about 620 nm to about 625 nm.

In one embodiment, the $K_2[Ge_{1-x}F_6]:Mn_x^{4+}$ phosphor of the present disclosure may be blended with other phosphors. For example, the luminescent material may further include a yellow light-emitting phosphor (such as a YAG yellow light-emitting phosphor or a silicate yellow light-emitting phosphor) and/or a green light-emitting phosphor (such as a β-SiAlON green light-emitting phosphor). The yellow light-emitting phosphor and/or the green light-emitting phosphor may be blended with the red light-emitting phosphor provided in the present disclosure to emit white light after being excited by blue light. In the blended phosphor, the ratio of the yellow light-emitting phosphor, the green light-emitting phosphor, and the red light-emitting phosphor is not limited. The ratio of any two of the blended phosphor may be in a range of 1:99 to 99:1. For example, the ratio of the yellow light-emitting phosphor, the green light-emitting phosphor, and the red light-emitting phosphor may be 1:1:1. The above ratio may be adjusted according to the actual need and the desired properties of the phosphor. The wavelength of the blue light which serves as the excitation light may be in a range of about 400 nm to about 500 nm, preferably from about 440 nm to about 480 nm. It should be noted that the excitation light, which excites the red light-emitting phosphor provided in the present disclosure, has a peak wavelength which does not overlap with the peak wavelength of yellow light (from about 570 nm to about 590 nm) and the peak wavelength of green light (from about 495 nm to about 570 nm). Accordingly, in a lighting apparatus such as an LED (for example, a blue LED) containing yellow light-emitting and/or green light-emitting luminescent materials, the color rendering index of the lighting apparatus may be increased by avoiding the loss of yellow light and/or green light and by the red light generated by the red light-emitting phosphor provided in the present disclosure.

FIG. 1A illustrates a cross-sectional view of a lighting apparatus 100 in accordance with an embodiment of the present disclosure. The lighting apparatus 100 includes an excitation light source 102 and a luminescent material 104 disposed on the excitation light source 102. In this embodiment, the excitation light source 102 is a blue LED disposed on a lead frame 106. The excitation light source 102 is covered by a transparent resin 108 mixed with the luminescent material 104. A packaging material 110 is used to package the excitation light source 102, the lead frame 106, and the transparent resin 108. It should be realized that the above arrangement and schematic of the lighting apparatus is merely one of the examples of the present disclosure. The present disclosure is not limited thereto. It will be apparent to those skilled in the art that various modifications and variations can be made to the disclosed embodiments.

Figure 1B:
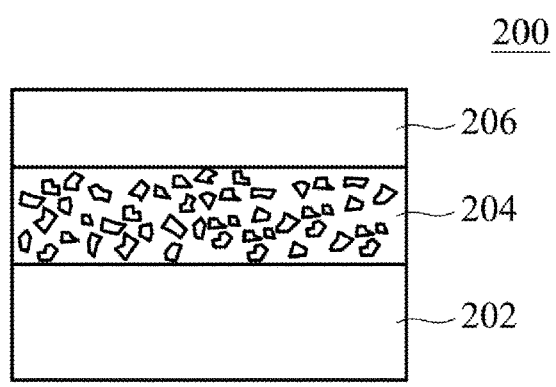

FIG. 1B illustrates a cross-sectional view of a lighting apparatus 200 in accordance with another embodiment of the present disclosure. The lighting apparatus 200 includes an excitation light source 202 and a luminescent material 204 disposed on the excitation light source 202. In this embodiment, a transparent transmissive optical element 206 is disposed on the luminescent material 204. The transparent transmissive optical element 206 has a light-extraction property. The transparent transmissive optical element 206 may be a single layer or a multilayer of polymer, a silicon layer, or a resin layer.

In yet another embodiment, a backlight module is provided. The backlight module includes at least one of the aforementioned lighting apparatuses. The detailed description of the lighting apparatus is similar to the content described above, and hence is not described again to avoid unnecessary repetition. The backlight module may be applied to displays (such as liquid-crystal displays) and may serve as a direct-light type backlight module or a side-edge backlight module for displays.

For example, the backlight module includes a lighting apparatus that produces a white light. The lighting apparatus includes an excitation light source, a green light-emitting phosphor, and the red light-emitting $K_2[Ge_{1-x}F_6]:Mn_x^{4+}$ phosphor provided in the present disclosure, wherein the excitation light source emits a blue light, a UV light, or a near-UV light. The emission wavelength of the excitation light source is from about 320 nm to about 500 nm.

The Examples are described below to illustrate the method for fabricating the phosphor, and the structures and properties of the phosphor.

EXAMPLE 1

Fabrication of $K_2Ge_{0.95}F_6:Mn_{0.05}^{4+}$ Phosphor 0.2000 g of manganese potassium hexafluorophosphate ($K_2MnF_6$) was dissolved in germanium dioxide/hydrofluoric acid ($GeO_2$/HF)(1.3911 g/7.5 mL) aqueous solution. Then, the potassium fluoride/hydrofluoric acid (KF/HF)(2.3250 g/7.5 mL) solution was added dropwise to the $GeO_2$/HF/$K_2MnF_6$ mixed solution to produce a yellow precipitation. Next, after being filtered thrice with 20 mL of ethanol, the precipitation was oven-dried at 50° C. Then, $K_2Ge_{0.95}F_6:Mn_{0.05}^{4+}$ phosphor was obtained.

EXAMPLE 2

Emission Spectra of $K_2Ge_{0.95}F_6:Mn_{0.05}^{4+}$ Phosphor

Figure 2A:
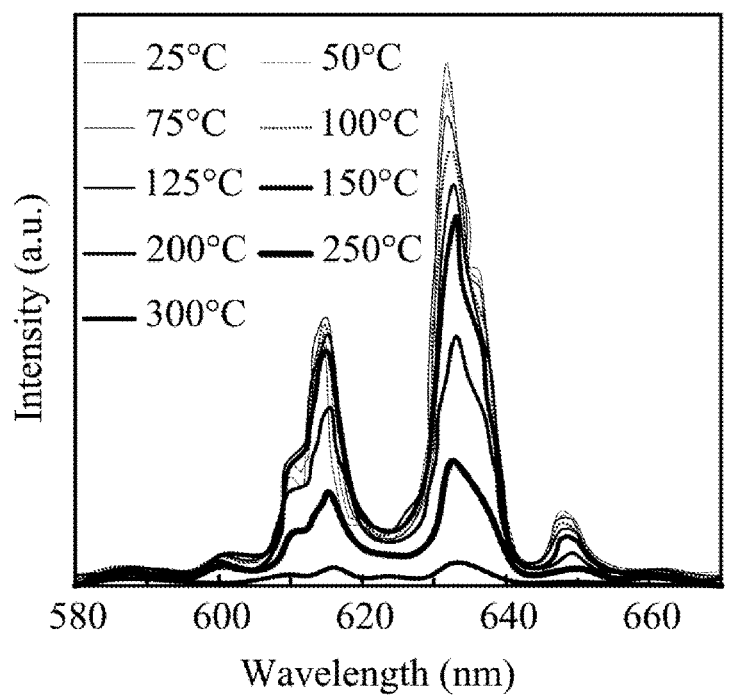
FIG. 2A illustrates emission spectra of $K_2Ge_{0.95}F_6$:$Mn_{0.05}^{4+}$ phosphor obtained at different heating temperatures in accordance with some embodiments of the present disclosure.
Figure 2B:
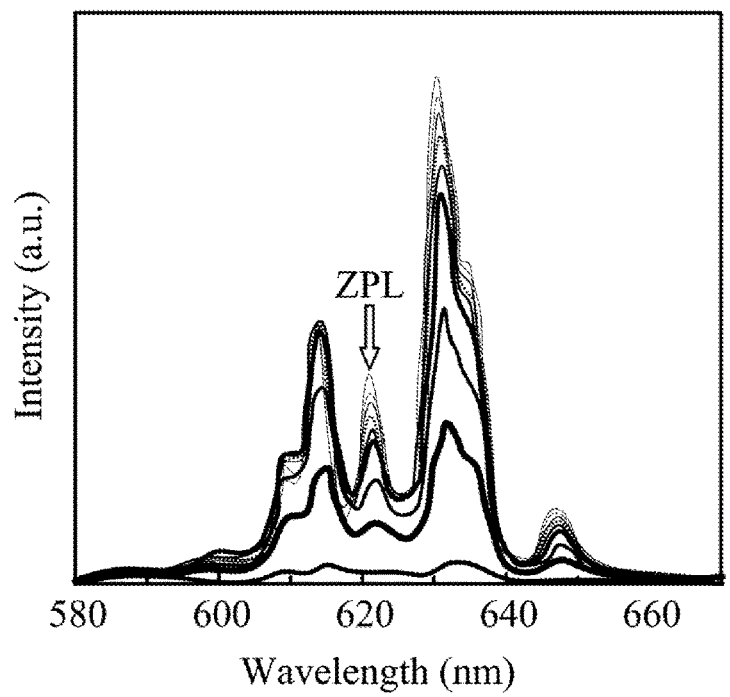
FIG. 2B illustrates emission spectra of $K_2Ge_{0.95}F_6$:$Mn_{0.05}^{4+}$ phosphor obtained at cooling temperatures (300-25° C.) in accordance with some embodiments of the present disclosure.

A thermal treatment was performed to $K_2Ge_{0.95}F_6:Mn_{0.05}^{4+}$ phosphor formed in Example 1. The emission spectra of $K_2Ge_{0.95}F_6:Mn_{0.05}^{4+}$ phosphor obtained at different heating temperatures and the emission spectra of $K_2Ge_{0.95}F_6:Mn_{0.05}^{4+}$ phosphor obtained at cooling temperatures (300-25° C.) were measured. The results are shown in FIGS. 2A and 2B, respectively. In FIG. 2B, a ZPL peak is clearly observed at 620-625 nm.

EXAMPLE 3

XRD Patterns of $K_2Ge_{0.95}F_6:Mn_{0.05}^{4+}$ Phosphor

Figure 3:
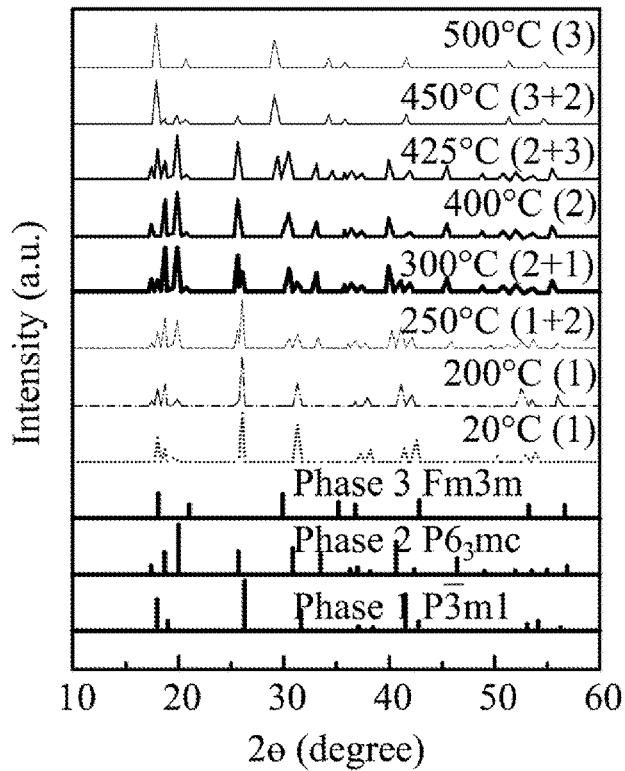
FIG. 3 illustrates X-ray diffraction (XRD) patterns of $K_2Ge_{0.95}F_6$:$Mn_{0.05}^{4+}$ phosphor obtained at different heating temperatures in accordance with some embodiments of the present disclosure.

The X-ray diffraction (XRD) patterns of $K_2Ge_{0.95}F_6:Mn_{0.05}^{4+}$ phosphor obtained at different heating temperatures were recorded with an X-ray powder diffractometer. The results are shown in FIG. 3. The structural change of $K_2Ge_{0.95}F_6:Mn_{0.05}^{4+}$ phosphor is clearly observed. The inorganic crystal structure database (ICSD) shown in the last three rows from the bottom of FIG. 3 are the standard patterns from the Joint Committee on Powder Diffraction Standards (JCPDS), which represents the standard patterns of three different space groups of the crystal structure. Phase 1 represents a P$\bar{3}$m1 space group. Phase 2 represents a P6$_3$mc space group. Phase 3 represents an Fm3m space group.

After comparing the XRD patterns of $K_2Ge_{0.95}F_6:Mn_{0.05}^{4+}$ phosphor obtained at different heating temperatures with the corresponding standard patterns, it was found that only the pure phase of $K_2Ge_{0.95}F_6:Mn_{0.05}^{4+}$ phosphor is observed when the heating temperature is between 20° C. and 200° C., wherein the pure phase is a P$\bar{3}$m1 space group corresponding to phase 1. When the heating temperature is increased to 250° C., $K_2Ge_{0.95}F_6:Mn_{0.05}^{4+}$ phosphor has both P$\bar{3}$m1 space group and P6$_3$mc space group which respectively corresponds to phase 1 and phase 2, whereas the main phase of $K_2Ge_{0.95}F_6:Mn_{0.05}^{4+}$ phosphor is still phase 1. In FIG. 3, it is represented by (1+2). When the heating temperature is increased to 300° C., $K_2Ge_{0.95}F_6:Mn_{0.05}^{4+}$ phosphor also has both P$\bar{3}$m1 space group and P6$_3$mc space group which respectively correspond to phase 1 and phase 2, whereas the main phase of $K_2Ge_{0.95}F_6:Mn_{0.05}^{4+}$ phosphor is phase 2. In FIG. 3, it is represented by (2+1). When the heating temperature is increased to 400° C., $K_2Ge_{0.95}F_6:Mn_{0.05}^{4+}$ phosphor has a pure P6$_3$mc space group which corresponds to phase 2. When the heating temperature is increased to 425° C., $K_2Ge_{0.95}F_6:Mn_{0.05}^{4+}$ phosphor has both P6$_3$mc space group and Fm3m space group which respectively corresponds to phase 2 and phase 3, whereas the main phase of $K_2Ge_{0.95}F_6:Mn_{0.05}^{4+}$ phosphor is phase 2. In FIG. 3, it is represented by (2+3). When the heating temperature is increased to 450° C., $K_2Ge_{0.95}F_6:Mn_{0.05}^{4+}$ phosphor has both P6$_3$mc space group and Fm3m space group which respectively corresponds to phase 2 and phase 3, whereas the main phase of $K_2Ge_{0.95}F_6:Mn_{0.05}^{4+}$ phosphor is phase 3. In FIG. 3, it is represented by (3+2). When the heating temperature is increased to 500° C., $K_2Ge_{0.95}F_6:Mn_{0.05}^{4+}$ phosphor has a pure Fm3m space group which corresponds to phase 3.

The above results prove that the crystal structure of $K_2Ge_{0.95}F_6:Mn_{0.05}^{4+}$ phosphor is successfully changed by performing a thermal treatment. In particular, when the temperature of thermal treatment is between 250° C. and 450° C., $K_2Ge_{0.95}F_6:Mn_{0.05}^{4+}$ phosphor with a P$\bar{3}$m1 space group are structurally changed to $K_2Ge_{0.95}F_6:Mn_{0.05}^{4+}$ phosphor with a P6$_3$mc space group.

According to the results shown in Examples 2-3 and FIGS. 2-3, when the temperature of thermal treatment is between 250° C. and 450° C., the obtained $K_2Ge_{0.95}F_6:Mn_{0.05}^{4+}$ phosphor has a crystal structure of P6$_3$mc space group corresponding to phase 2 and show red fluorescence emission with a ZPL peak. In comparison, without a further thermal treatment, the initial $K_2Ge_{0.95}F_6:Mn_{0.05}^{4+}$ phosphor formed in Example 1 has a P$\bar{3}$m1 space group. Although the initial $K_2Ge_{0.95}F_6:Mn_{0.05}^{4+}$ phosphor formed in Example 1 also shows a red fluorescence emission, it does not show a ZPL peak.

EXAMPLE 4

Figure 4:
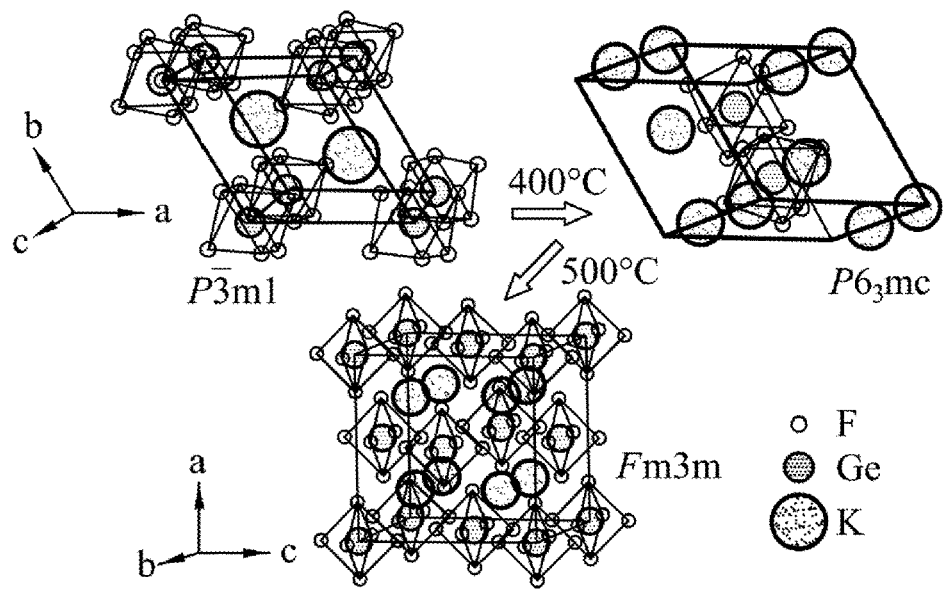
FIG. 4 illustrates a schematic of the crystal structures of $K_2Ge_{0.95}F_6$:$Mn_{0.05}^{4+}$ phosphor obtained at different heating temperatures in accordance with some embodiments of the present disclosure.

Schematics of the Crystal Structure of $K_2Ge_{0.95}F_6:Mn_{0.05}^{4+}$ Phosphor Obtained at Different Heating Temperatures FIG. 4 illustrates schematics of the crystal structure of $K_2Ge_{0.95}F_6:Mn_{0.05}^{4+}$ phosphor obtained at different heating temperatures. The structures correspond to the results observed in FIG. 3. It can be observed in FIG. 4 that $K_2Ge_{0.95}F_6:Mn_{0.05}^{4+}$ phosphor formed in Example 1 without a further thermal treatment has a P$\bar{3}$m1 space group. However, with the increased heating temperature, a hexagonal phase with a P6$_3$mc space group gradually emerges. When the heating temperature is increased to 400° C., the crystal structure of $K_2Ge_{0.95}F_6:Mn_{0.05}^{4+}$ phosphor completely changes to a pure hexagonal phase with a P6$_3$mc space group. With the continuously increased heating temperature, a Fm3m space group gradually emerges. When the heating temperature is increased to 500° C., the crystal structure of $K_2Ge_{0.95}F_6:Mn_{0.05}^{4+}$ phosphor completely changes to a pure phase with an Fm3m space group.

EXAMPLE 5

Figure 5:
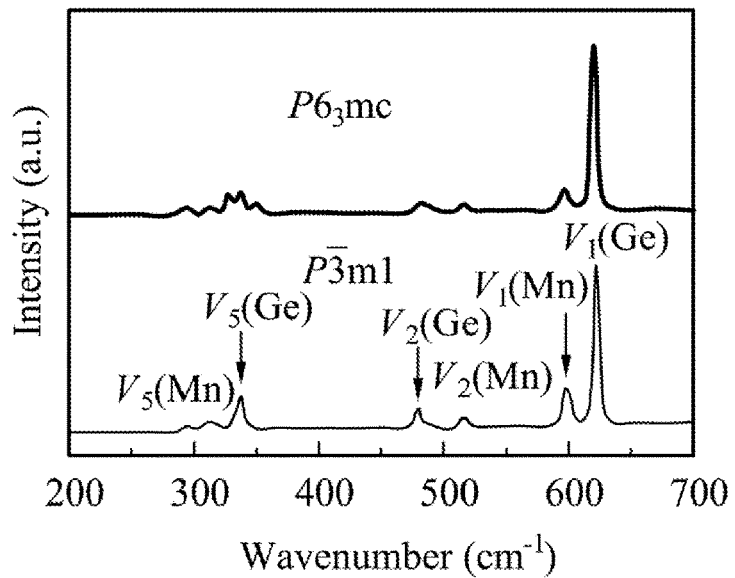
FIG. 5 illustrates Raman spectra of $K_2Ge_{0.95}F_6$:$Mn_{0.05}^{4+}$ phosphor before and after a thermal treatment in accordance with some embodiments of the present disclosure.

Raman Spectra of $K_2Ge_{0.95}F_6:Mn_{0.05}^{4+}$ Phosphor Obtained Before and After a Thermal Treatment FIG. 5 illustrates Raman spectra of $K_2Ge_{0.95}F_6:Mn_{0.05}^{4+}$ phosphor obtained before and after a thermal treatment (400° C. calcination for 0.5 hours). The upper spectrum illustrates the Raman spectrum of the phosphor formed in Example 1 after a thermal treatment. The lower spectrum illustrates the Raman spectrum of the phosphor formed in Example 1 before a thermal treatment. It can be clearly observed from FIG. 5 that the signal strengths of the vibration mode $v_1(A_{1g})$, $v_2(E_g)$, $v_3(T_{1u})$, $v_4(T_{1u})$, $v_5(T_{2g})$, and $v_6(T_{2u})$ of $K_2Ge_{0.95}F_6:Mn_{0.05}^{4+}$ phosphor are changed after the thermal treatment, which means that the crystal structure of $K_2Ge_{0.95}F_6:Mn_{0.05}^{4+}$ phosphor is indeed changed after the thermal treatment.

EXAMPLE 6

Figure 6:
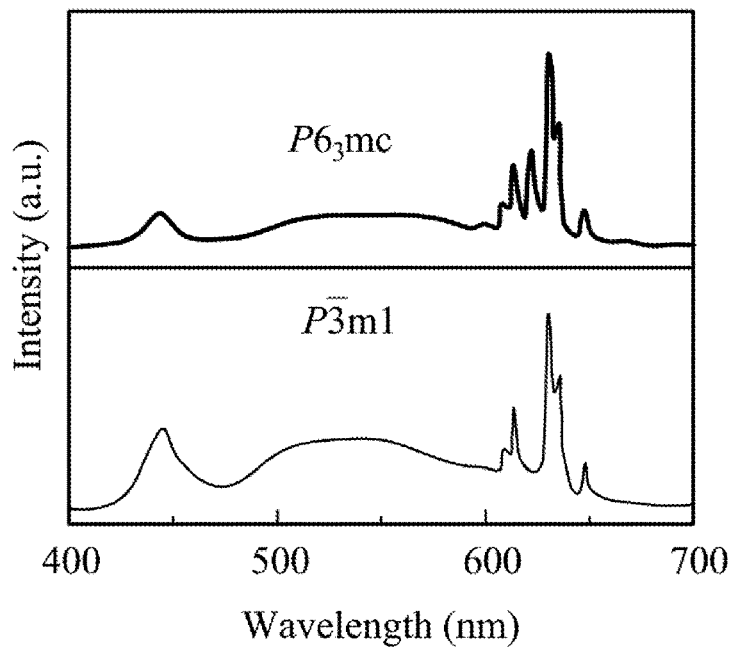
FIG. 6 illustrates white light spectra produced by a blue light-emitting chip (the emitting wavelength is between 400 nm and 500 nm) accompanied by $K_2Ge_{0.95}F_6$:$Mn_{0.05}^{4+}$ phosphor and YAG yellow light-emitting phosphor before and after $K_2Ge_{0.95}F_6$:$Mn_{0.05}^{4+}$ phosphor being performed with a thermal treatment in accordance with some embodiments of the present disclosure.

White Light Spectra of a Blue Light-Emitting Chip Accompanied by $K_2Ge_{0.95}F_6:Mn_{0.05}^{4+}$ Phosphor and YAG Yellow Light-Emitting Phosphor Before and $K_2Ge_{0.95}F_6:Mn_{0.05}^{4+}$ Phosphor Being Performed with a Thermal Treatment FIG. 6 illustrates white light spectra of a blue LED chip accompanied by $K_2Ge_{0.95}F_6:Mn_{0.05}^{4+}$ phosphor formed in Example 1 and YAG yellow light-emitting phosphor ($Y_3Al_5O_{12}$:Ce; Yttrium aluminum garnet) before and after $K_2Ge_{0.95}F_6:Mn_{0.05}^{4+}$ phosphor being performed with a thermal treatment (400° C. calcination for 0.5 hours). The upper spectrum illustrates the white light spectra after $K_2Ge_{0.95}F_6:Mn_{0.05}^{4+}$ phosphor formed in Example 1 was performed with a thermal treatment. The lower spectrum illustrates the white light spectra before $K_2Ge_{0.95}F_6:Mn_{0.05}^{4+}$ phosphor formed in Example 1 was performed with a thermal treatment. It can be clearly observed from FIG. 6 that $K_2Ge_{0.95}F_6:Mn_{0.05}^{4+}$ phosphor shows a ZPL peak at 620-625 nm after a thermal treatment was performed.

From the above, a method for fabricating a phosphor is provided in the present disclosure. By performing a thermal treatment (from 250° C. to 450° C.), the crystal structure of $K_2Ge_{0.95}F_6:Mn_{0.05}^{4+}$ phosphor is changed from a hexagonal phase with a P$\bar{3}$m1 space group to a hexagonal phase with a P6$_3$mc space group. Also, the structurally changed phosphor shows a ZPL peak. The resulting red light-emitting phosphor may be used to enable blue LEDs to produce red fluorescence. Also, the resulting red light-emitting phosphor accompanied by YAG yellow light-emitting phosphor ($Y_3Al_5O_{12}$:Ce; Yttrium aluminum garnet) and/or green light-emitting phosphor may be applied to blue LEDs to produce white light and increase the color rendering index thereof.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor represented by the following formula: $K_2[Ge_{1-x}F_6]:Mn_x^{4+}$, wherein 0<x<0.2, wherein the phosphor has a hexagonal phase with a P6$_3$mc space group.

2. The phosphor as claimed in claim 1, wherein the phosphor shows a zero phonon line (ZPL) having a peak wavelength in a range of about 620 nm to about 625 nm.

3. The phosphor as claimed in claim 1, wherein the phosphor emits a red light having a peak wavelength in a range of 600 nm to 650 nm after being excited by a light having a peak wavelength in a range of about 320 nm to about 500 nm.

4. A method for fabricating a phosphor, comprising:
 (a) providing a primary phosphor represented by the following formula:
  $K_2[Ge_{1-x}F_6]:Mn_x^{4+}$, wherein 0<x<0.2, wherein the primary phosphor has a hexagonal phase with a P$\bar{3}$m1 space group; and
 (b) performing a thermal treatment to structurally change the primary phosphor to a phosphor having a hexagonal phase with a P6$_3$mc space group.

5. The method for fabricating the phosphor as claimed in claim 4, wherein the thermal treatment is performed with a temperature in a range of about 250° C. to about 450° C. for about 20 minutes.

6. The method for fabricating the phosphor as claimed in claim 4, wherein the thermal treatment is performed with a temperature of about 400° C. for about 20 minutes.

7. The method for fabricating the phosphor as claimed in claim 4, wherein the phosphor shows a zero phonon line (ZPL) having a peak wavelength in a range of about 620 nm to about 625 nm.

8. The method for fabricating the phosphor as claimed in claim 4, wherein the phosphor emits a red light having a peak wavelength in a range of 600 nm to 650 nm after being excited by a light having a peak wavelength in a range of about 320 nm to about 500 nm.

9. A lighting apparatus, comprising:
an excitation light source;
a luminescent material disposed on the excitation light source, wherein the luminescent material comprises:
a phosphor represented by the following formula:
$K_2[Ge_{1-x}F_6]:Mn_x^{4+}$, wherein 0<x<0.2,
wherein the phosphor has a hexagonal phase with a $P6_3mc$ space group.

10. The lighting apparatus as claimed in claim 9, wherein the excitation light source comprises a light-emitting diode having an emission wavelength in a range of about 320 nm to about 500 nm.

11. The lighting apparatus as claimed in claim 9, wherein the phosphor shows a zero phonon line (ZPL) having a peak wavelength in a range of about 620 nm to about 625 nm.

12. The lighting apparatus as claimed in claim 9, wherein the phosphor emits a red light having a peak wavelength in a range of 600 nm to 650 nm after being excited by a light emitted by the excitation light source.

13. The lighting apparatus as claimed in claim 9, wherein the luminescent material further comprises a yellow light-emitting phosphor and/or a green light-emitting phosphor.

14. The lighting apparatus as claimed in claim 13, wherein the lighting apparatus produces white light.

15. A backlight module, comprising at least one of the lighting apparatus as claimed in claim 9.

* * * * *